(12) United States Patent
Lin et al.

(10) Patent No.: US 7,279,428 B2
(45) Date of Patent: Oct. 9, 2007

(54) METHOD OF PREVENTING PHOTORESIST RESIDUES

(75) Inventors: Shang Wei Lin, Taipei (TW); Hung Chang Hsieh, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 29 days.

(21) Appl. No.: 10/736,918

(22) Filed: Dec. 16, 2003

(65) Prior Publication Data
US 2005/0106889 A1    May 19, 2005

Related U.S. Application Data

(60) Provisional application No. 60/523,275, filed on Nov. 19, 2003.

(51) Int. Cl.
*H01L 21/302* (2006.01)

(52) U.S. Cl. .............. 438/710; 438/706; 438/714; 438/725; 134/1.1; 134/1.2; 134/1.3; 216/18; 216/39; 216/58; 216/67

(58) Field of Classification Search ......... 438/710; 134/1.1
See application file for complete search history.

(56) References Cited

U.S. PATENT DOCUMENTS

| | | | |
|---|---|---|---|
| 6,013,579 A | 1/2000 | Wang et al. | |
| 6,162,583 A | 12/2000 | Yang et al. | |
| 6,281,135 B1 * | 8/2001 | Han et al. | 438/725 |
| 6,319,809 B1 | 11/2001 | Chang et al. | |
| 6,492,280 B1 * | 12/2002 | DeOrnellas et al. | 438/714 |
| 6,534,397 B1 | 3/2003 | Okada et al. | |
| 6,805,139 B1 * | 10/2004 | Savas et al. | 134/1.3 |
| 2001/0036740 A1 | 11/2001 | Shields et al. | |

OTHER PUBLICATIONS

Wolf, Silicon Processing for the VLSI Era, 2002, Lattice Press, vol. 4, pp. 690, 692-693.*

Wolf, Silicon Processing for the VLSI Era, 2002, Lattice Press, vol. 4, p. 725.*

Rossnagel et al., Handbook of Plasma Processing, 1990, Noyes Publications, pp. 198.*

* cited by examiner

*Primary Examiner*—Lan Vinh
*Assistant Examiner*—Maki Angadi
(74) *Attorney, Agent, or Firm*—Duane Morris LLP

(57) ABSTRACT

A method to prevent photoresist residues formed in an aperture is provided. The method includes using a halogen-containing plasma treatment before the aperture is filled with a photoresist. Due to the halogen-containing plasma treatment, amine components on the sidewalls of a via or contact hole or trench opening can be efficiently removed. Accordingly, photoresist residues or via poison can be avoided.

29 Claims, 5 Drawing Sheets

METHOD OF PREVENTING PHOTORESIST RESIDUES

BACKGROUND OF THE INVENTION

This application claims the benefit of U.S. Provisional Application No. 60/523,275, filed Nov. 19, 2003.

FIELD OF THE INVENTION

The present invention relates to a method of fabrication for semiconductor integrated circuits. More particularly, the present invention relates to a method of forming a dual damascene structure in semiconductor integrated circuits.

DESCRIPTION OF THE RELATED ART

In a semiconductor chip, a variety of devices are interconnected by metal conductive wires. Generally, metal conductive wires and semiconductor integrated circuit devices are connected by contacts, and metal conductive wires are connected by vias. Usually, the metal conductive wires and the via or contact connection points are formed by different photographic processes, etching processes and thin film deposition processes. The size of semiconductor devices has been continuously shrinking, resulting in smaller semiconductor chip size and increasing the device density. As a result, misalignment between two different patterned layers frequently occurred. Some methods have been proposed and implemented to improve the resolution of photolithography in the semiconductor wafer manufacturing process. For example, Deep Ultra-Violet (DUV) and Extreme Ultra-Violet (EUV) technique are the new techniques used to enhance the resolution in semiconductor manufacturing by using a light source having a wavelength of 193 nm or 157 nm.

Another issue of the multilayer interconnect structure of semiconductor integrated circuits is resistance-capacitance (RC) delay due to resistance of the metal conductive wires and parasitic capacitance between conductive wires. They are major factors that are likely to affect the operating speed of the semiconductor integrated circuits. Various methods or materials have been proposed and used to resolve the issue of RC delay. For example, low-k dielectric materials are favored in the semiconductor industry because they have low dielectric constants (k). In addition, copper with lower electrical resistance has been used to replace aluminum-copper (Al—Cu) as a conductive material. Because of the low dielectric constant of the low-k material and lower electrical resistance of copper, RC delay is efficiently reduced in the multilayer interconnect structure of semiconductor integrated circuits. However, copper is difficult to etch by the traditional etching process. A dual damascene process is normally employed to fabricate copper interconnects instead of a conventional patterning method.

Generally, the dual damascene process can be divided into the trench first dual damascene process and the via-first dual damascene process. In the trench first dual damascene process, a trench opening is formed on the top of an inter-metal dielectric (IMD) layer. Then a patterned photoresist layer for forming a via structure is formed above the IMD layer having the trench opening. Usually, the patterned photoresist layer for forming a via structure is formed within the trench opening. A subsequent etching process is used to form the via hole within the IMD layer. Finally, the via hole and the trench opening are filled with a conductive material, for example, Al—Cu or Cu, to form vias and trench wires, respectively.

In the via-first dual damascene process, a via structure is firstly etched in an IMD layer having an etch stop layer. Then a patterned photoresist layer for forming a trench structure is formed above the wafer with the via structure. The trench structure is formed by an etching process and the etch stop layer is used to remove a part of the IMD layer. In addition, another feature of the via-first dual damascene process is to form a photoresist polymer plug in the via hole to protect the metal conductive layer under the via structure from damage resulting from the trench etching process. Finally, the via hole and the trench opening are filled with a metal, such as AlCu or Cu, to form vias and trench wires, respectively.

In either the via-first or the trench-first process, a dielectric layer is used as an anti-reflection coating (ARC) layer, and an etching or chemical-mechanical polish (CMP) stop layer is generally used in a dual damascene process. The reason to use the dielectric layer as an ARC layer is to avoid or eliminate interference or diffraction effects during a photolithographic process. In addition, for planarizing the surface of the multilayer structure of semiconductor integrated circuits, an etch-back or CMP process is required to achieve the purpose. Usually, a dielectric layer having strong bonding to resist the etch-back and CMP process is used in the process.

According to the requirements of the photolithographic process and planarization, silicon oxynitride is generally used as the dielectric layer to perform such functions. However, the dielectric layer also generates some issues in semiconductor integrated circuit fabrication.

One problem affecting DUV photolithographic processes has been the interaction of the nitrogen-containing dielectric layer with the DUV photoresist. Because of the existence of nitrogen radicals created due to the presence of a nitrogen-containing dielectric layer, the interaction of the nitrogen-containing dielectric layer with the DUV photoresist chemically amplifies the material properties of the photoresist, rendering a portion of the photoresist insoluble in the developer. As a result, residual photoresist may remain on patterned feature edges or sidewalls of the structure. Once the residuals appear in via or contact holes, this phenomenon is called via or contact poison. Therefore, some structures or methods have been proposed by the related art to resolve the problem resulting from the fabrication processes.

A method to reduce via poison in dual damascene is disclosed in U.S. Pat. No. 6,319,809. FIG. 1 illustrates a schematic cross-sectional drawing of the prior art. A substrate 100 is provided with a metal layer 110 and a first passivation layer 115. Then a first low-k dielectric layer 120, an etch-stop, layer 125, a second low-k dielectric layer 130, and a second passivation layer 135 are sequentially formed over the passivation layer 115. A via or a contact hole is formed within the multilayer structure by photolithographic and etch processes. After the removal of the photoresist, ultraviolet irradiation 160 is performed to clean the photoresist residues in the via or contact hole.

FIG. 2 illustrates another method for reduction of contact/via resistance and for photoresist removal disclosed in U.S. Pat. Application No. 2001/0036740. A substrate 200 is provided with a metal layer 210. An inter-layer dielectric (ILD) layer 220 and a photoresist layer 230 are formed above the substrate 200 sequentially. Then a contact or via hole 240 is formed within the ILD layer 220 and the photoresist layer 230. Then a $CF_4$ and $H_2O$ plasma 250 is used to remove the photoresist residues 260 formed during the via or contact hole etching process and the photoresist layer 230.

Accordingly, it is desirable to prevent photoresist residues in an aperture, such as a via, contact, or trench.

SUMMARY OF THE INVENTION

A method of preventing photoresist residues in an aperture is disclosed. The method includes using a halogen-containing plasma treatment before the aperture is filled with a photoresist material.

DESCRIPTION OF THE PREFERRED EMBODIMENT

U.S. Provisional Application No. 60/523,275, filed Nov. 19, 2003, is incorporated by reference as though set forth in it entirety herein.

FIGS. 3A-3D are a series of schematic cross-sectional diagrams showing exemplary fabrication processes of a via-first dual damascene structure within semiconductor integrated circuits.

Figure 1:
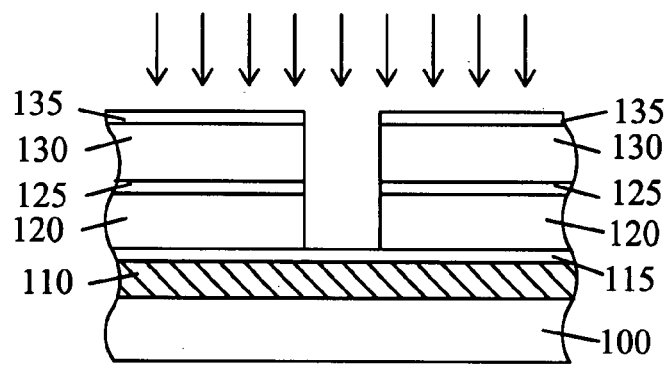
FIG. 1 is a schematic cross-sectional diagram of a structure of the related art.
Figure 2:
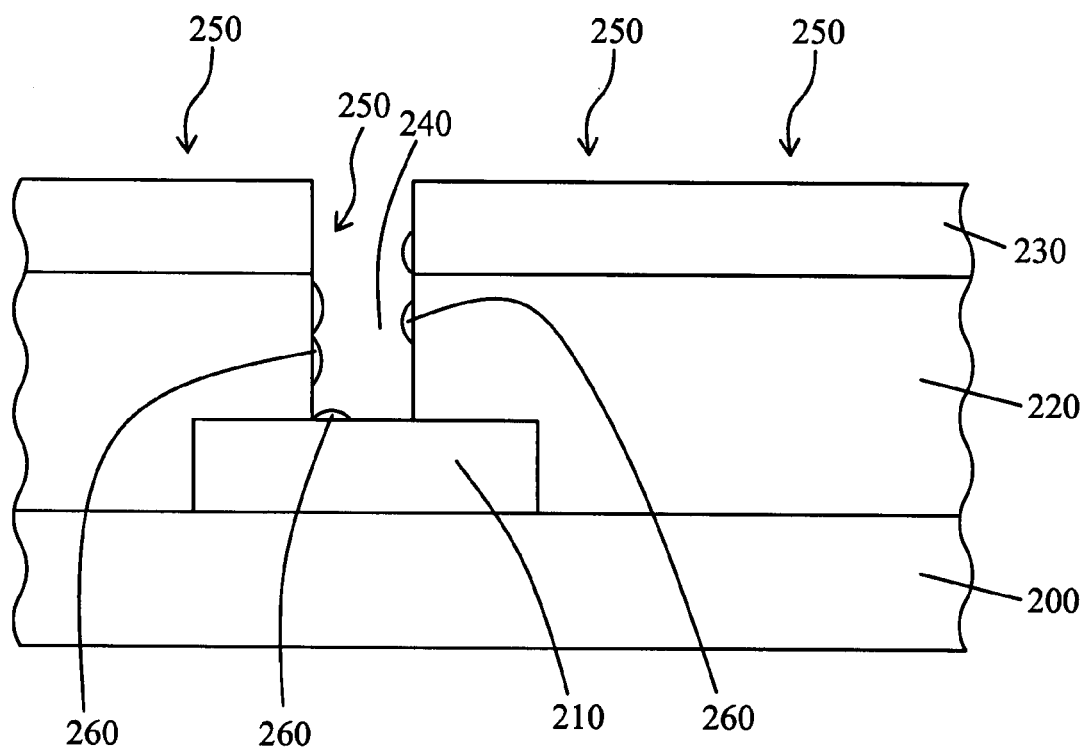
FIG. 2 is a schematic cross-sectional configuration of a structure of the another related art.
Figure 3A:
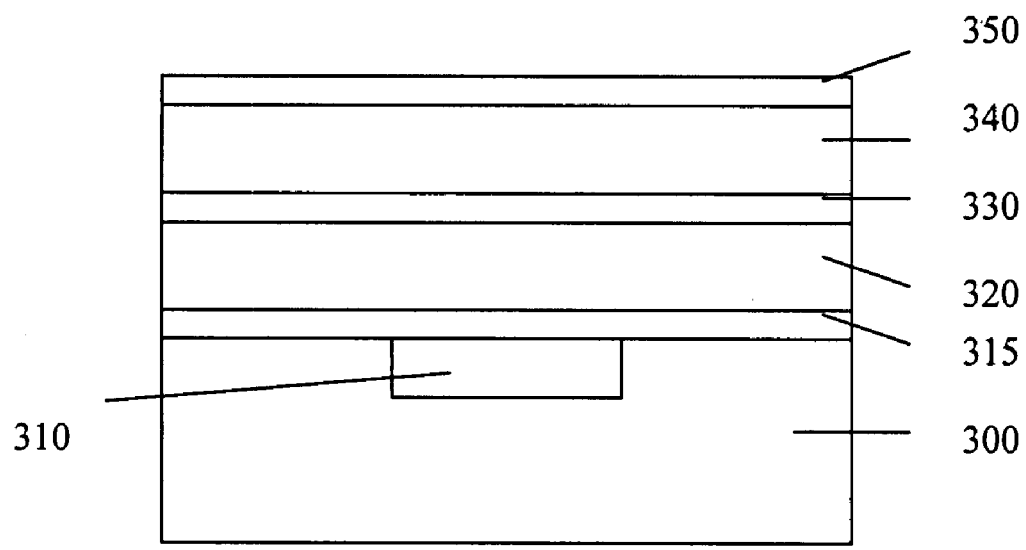
FIGS. 3A-3D are a series of schematic cross-sectional diagrams illustrating exemplary fabrication processes of a via-first dual damascene structure within semiconductor integrated circuits.

FIG. 3A is a schematic cross-sectional diagram illustrating a structure after forming a multilayer structure above a substrate 300.

The substrate 300 having a conductive wire 310 therein is provided. The substrate 300 is a semiconductor substrate having various devices thereupon. The semiconductor substrate can be, for example, a silicon substrate, silicon-germanium substrate, silicon-on-insulator (SOI) substrate, or III-V compound substrate. The conductive wire 310 is made from a conductive material, for example, Al—Cu or Cu. In addition, the conductive wire 310 can be formed either by an etch or CMP process.

Then a multilayer structure is formed above the substrate 300. A passivation layer 315, a first dielectric layer 320, an etch stop layer 330, a second dielectric layer 340 and a cap layer 350 are sequentially formed over the substrate 300.

The passivation layer 315 is used to protect the devices on the substrate 300 from the impurities created from the first dielectric layer 320. The passivation layer 315 can be, for example, a silicon nitride layer, silicon oxynitride layer or any other material that can substantially perform the same function of the passivation layer 315. In some embodiments using a silicon nitride layer as the passivation layer 315, the silicon nitride layer may have a thickness from about 300 angstroms (Å) to about 900 Å and be formed, for example, by atmospheric or low pressure chemical vapor deposition (APCVD or LPCVD), or plasma enhanced vapor deposition (PECVD). The etch stop layer 330 is used to for the purpose of forming a dual damascene structure, while preventing the underlying layers from damage resulting from a via or contact hole or trench etching process. Generally, an etching process should have a higher etching rate for the second dielectric layer 340 than for the etch stop layer 330. When a silicon nitride layer is used to perform the function of the etch stop layer 330, the silicon nitride layer may have a thickness from about 500 Å to about 700 Å and be formed, for example, by APCVD, LPCVD or PECVD. The cap layer 350 is used as an anti-reflection coating (ARC) layer for a subsequent photolithographic process. Moreover, the cap layer 350 can also perform functions of an etch stop layer, a passivation layer or both. The cap layer 350 can be, for example, a silicon nitride layer, silicon oxynitride layer or any other material that can substantially perform the same function of the cap layer 350. In some embodiments, the cap layer 350 is a silicon oxynitride layer having a thickness from about 500 Å to about 700 Å and formed, for example, by APCVD, LPCVD or PECVD.

The first dielectric layer 320 and the second dielectric layer 340 can be the same or different low-k dielectric materials with dielectric constants less than 3.0, for example, poly-arylene ether (SiLK), fluorinated poly-arylene ether (FLARE) or hydrogen silsesquioxane (HSQ). In some embodiments, each of the first dielectric layer 320 and the second dielectric layer 340 has a thickness from about 4000 Å to about 6000 Å and can be formed by, for example, spin-on coating or CVD. In some embodiments, the first dielectric layer 320 and the second dielectric layer 340 can be low-k dielectric materials with a dielectric constant more than 3.0.

One of the ordinary skill in the art can understand that the multilayer structure mentioned above depends on the technology used to fabricate the integrated circuits and new materials applied to the process. There is no requirement that all of these dielectric layers be formed above the substrate 300. Similarly, some configurations may include additional layers, in addition to those shown in FIG. 3A.

Figure 3B:
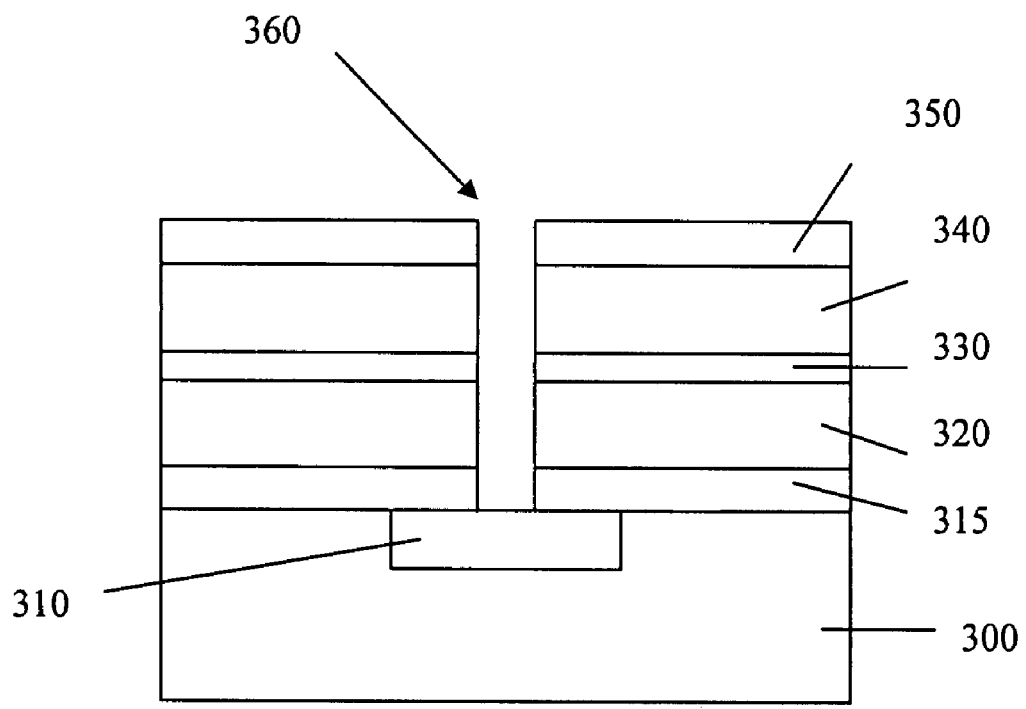

FIG. 3B is a schematic cross-sectional diagram illustrating a structure after an aperture 360 is formed within the multi-layer structure in accordance with FIG. 3A.

A photoresist layer (not illustrated) is formed above the cap layer 350. By a traditional photolithographic process, an opening is formed within the photoresist layer. Then the patterned photoresist layer is used as an etch mask to remove portions of the cap layer 350, the second dielectric layer 340, the etch stop layer 330, the first dielectric layer 320, and the passivation layer 315, and to form the aperture 360. In a via-first dual damascene structure, the aperture 360 is a via or contact hole. In addition, the removal of portions of the multi-layer structure can be performed by a sequential anisotropic etching process. The etching process can be performed in a single chamber or different chambers.

Figure 3C:
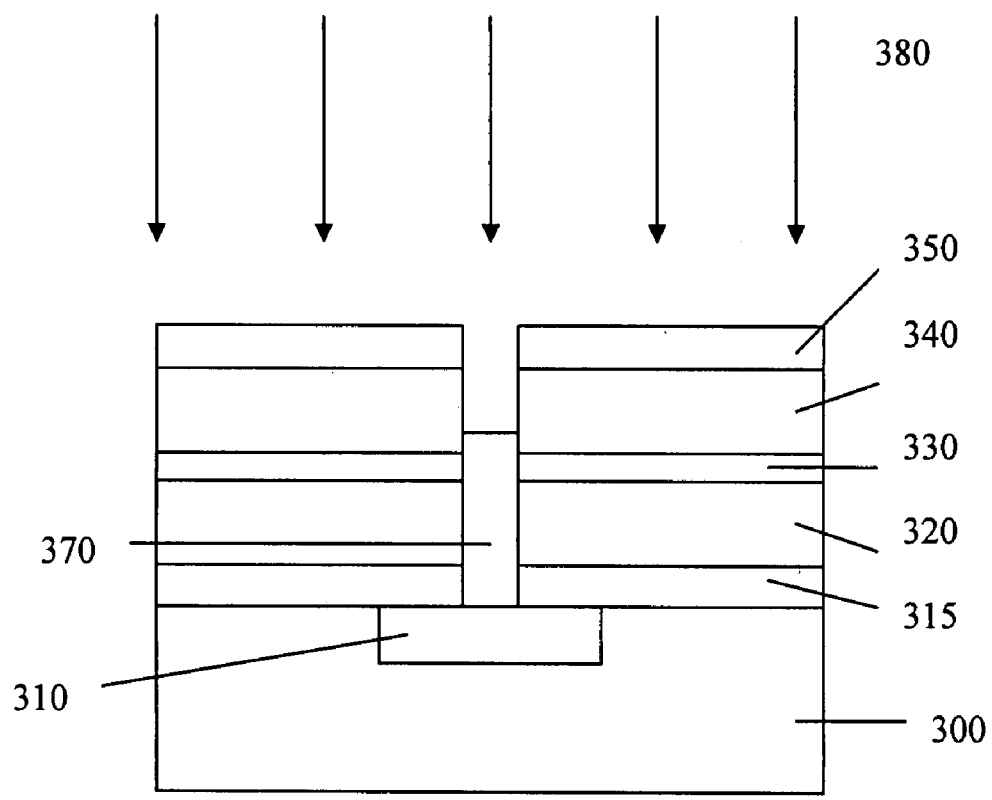

FIG. 3C is a schematic cross-sectional diagram illustrating a structure being treated by a plasma treatment 380 after a polymer plug 370 is formed partially in the via hole 360. The process for forming the plug 370 and the plasma treatment 380 is now described.

After forming the aperture 360, a filling material (not illustrated) is used to fill in the aperture 360 and to planarize the surface thereof. The filling material, for example, can be a polymer. In some embodiments, the polymer and can be formed by CVD. Then an etch-back process is performed to remove a portion of the filling layer and form the polymer plug 370 in the aperture 360 as shown in FIG. 3C. The purpose of forming the polymer plug 370 is used to protect the conductive wire 310 from damages resulting from subsequent etching processes. However, there is no requirement that the polymer plug 370 be formed in the aperture 360, but it is more advantageous to use the polymer plug protecting the substrate 300 from subsequent etching damages.

Then the plasma treatment 380 is applied. The plasma treatment 380 is a plasma treatment containing a halogen, for example, fluorine, chlorine, bromine or indium. If chlorine-containing plasma is used to treat the substrate, a chlorine-containing gas can be used as a source gas selected from a group consisting of $Cl_2$, HCl, $C_xCl_y$, $C_xH_yCl_z$ and mixtures thereof to generate the chlorine-containing plasma. In some embodiments, the plasma treatment 380 may further comprise nitrogen components and inert gas components. The nitrogen components can be generated from a nitrogen-containing gas, for example, $N_2$ or $N_2O$. The inert gas component can be generated from, for example, helium, neon, argon, or xenon. In some embodiments, $Cl_2$ used as the plasma source gas can have a flow rate from about 5 to about 400 sccm, Ar has a flow rate from about 10 to about 400 sccm, and $N_2/O_2$ can also be applied in the exemplary plasma treatment. In these embodiments, the plasma treatment 380 can be performed in a tool having a dual power system, by applying a top electrode power from about 200 to about 2000 watts, and a bottom electrode power from about 0 to about 400 watts. One of the ordinary skill in the art will understand how to fine tune the conditions disclosed in the exemplary embodiment or variations thereof to achieve the purpose of removing nitrogen-containing components or amine in the aperture 360.

Figure 3D:
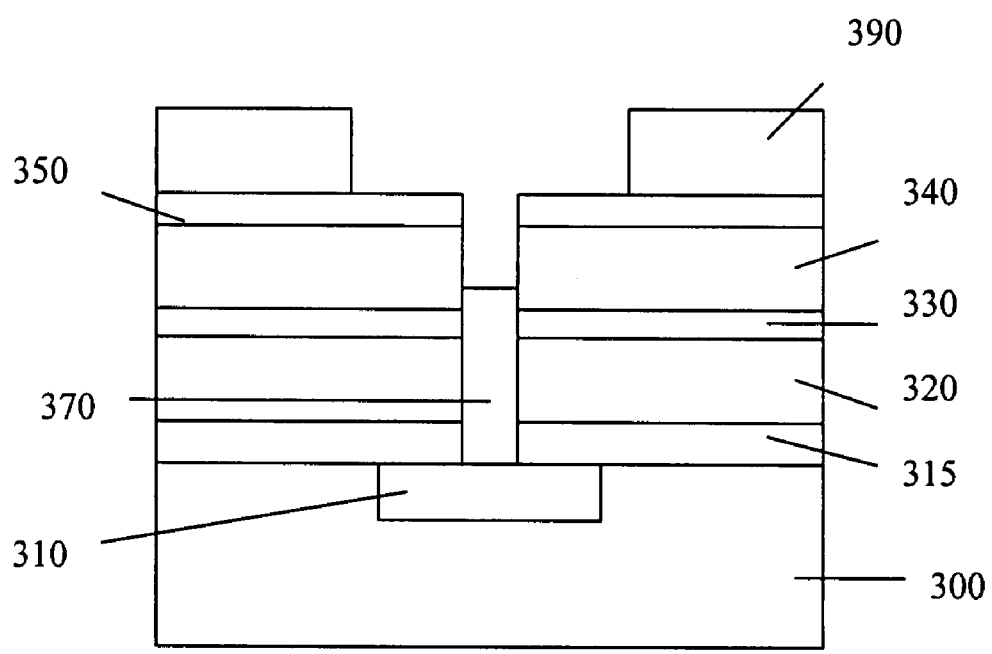

FIG. 3D shows a schematic cross-sectional diagram illustrating a structure after forming a patterned photoresist layer 390.

The purpose of the photoresist layer 390 is to form a trench pattern for a via-first dual damascene structure. The photoresist layer 390 can be, for example, a Deep Ultra-Violet (DUV) photoresist layer or any other material that can interact with nitrogen-containing material or low-k dielectric material. As mentioned above, nitrogen-containing material or low-k dielectric material is the source of amine. Due to the presence of amine, photoresist, especially DUV photoresist, cannot be fully transformed to a photo acid layer after being exposed to light. Therefore, the photoresist residues may attach on patterned feature edges or sidewalls of the aperture. Before the photoresist layer 390 is used to form a trench pattern on the substrate, the plasma treatment 380 is performed, completely or substantially reducing nitrogen-containing components or amine on the surface of the cap layer 350 and the sidewalls of the aperture 360. Because the plasma treatment 380 can react with amine to form photo acid, the photoresist layer 390 for forming the trench pattern will not react with the multilayer structure due to the elimination or reduction of amine.

Figure 4A:
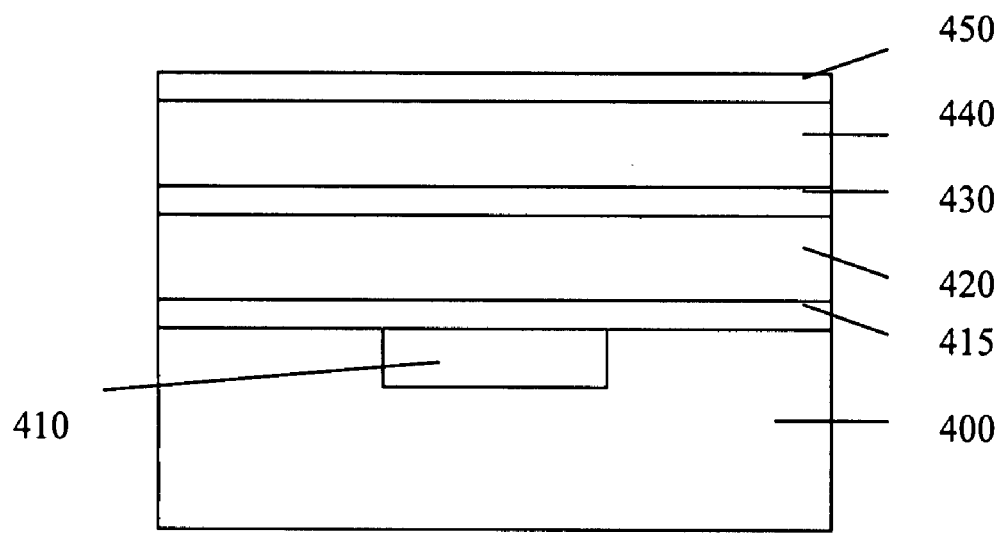
FIGS. 4A-4C are a series of schematic cross-sectional diagrams illustrating exemplary fabrication processes of a trench-first dual damascene structure within semiconductor integrated circuits.
Figure 4B:
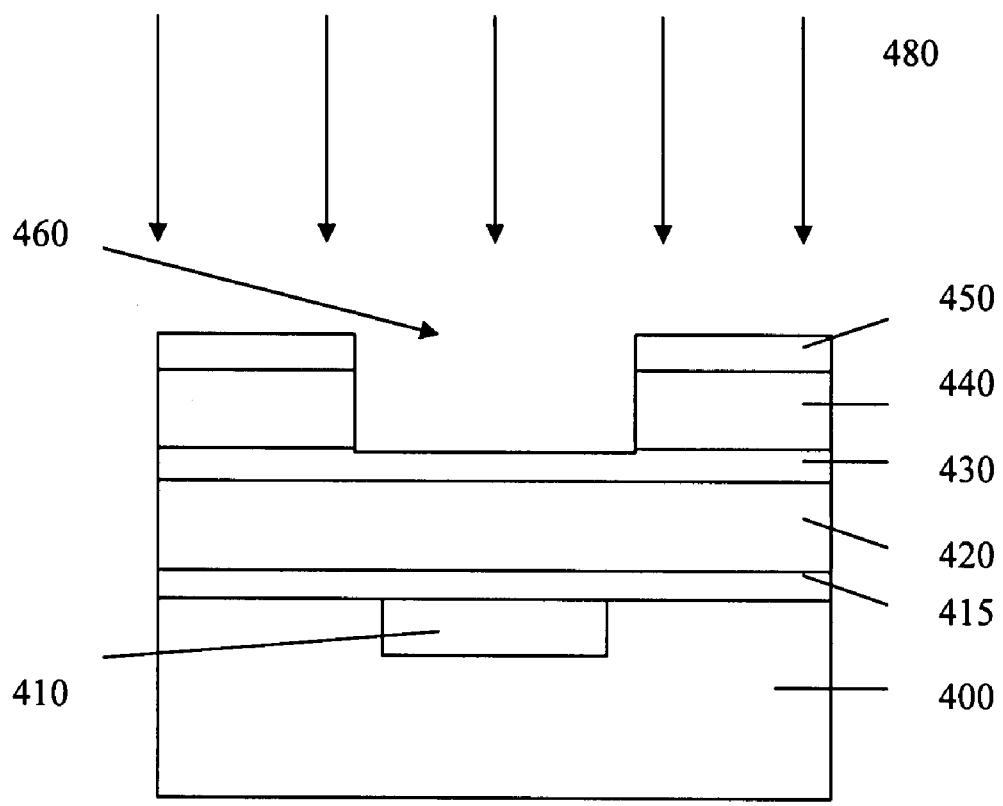
Figure 4C:
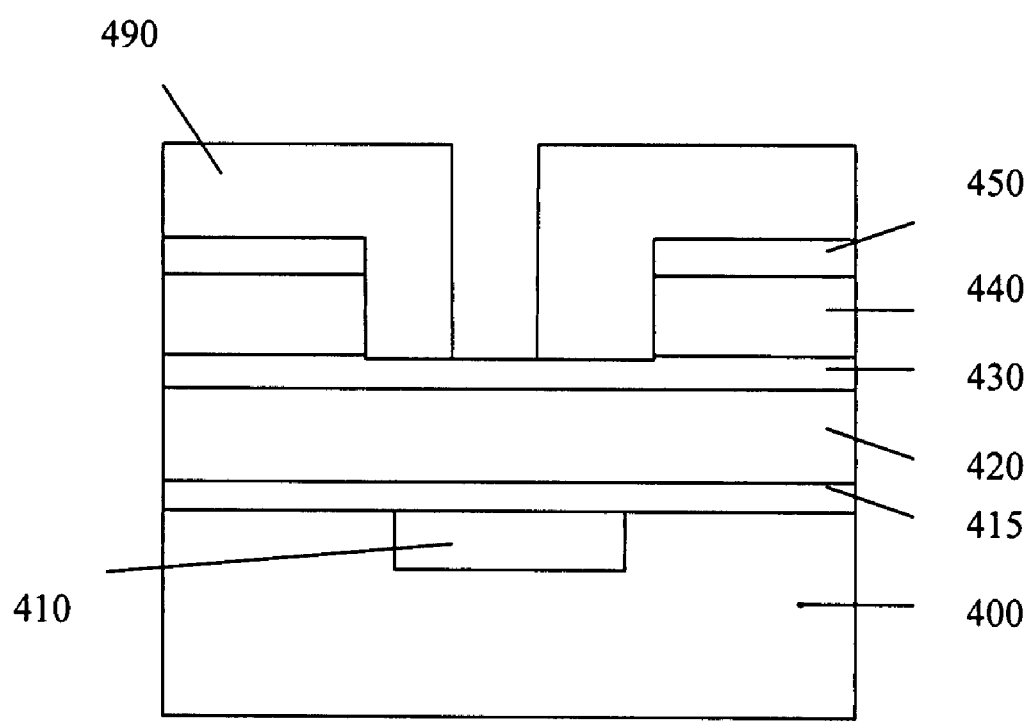

FIGS. 4A-4C are a series of schematic cross-sectional diagrams showing exemplary fabrication processes of a trench-first dual damascene structure within semiconductor integrated circuits. Items of FIGS. 4A-4C that are the same items in FIG. 3A-3D are indicated by the same reference numerals, increased by 100. They include the substrate 400, the conductive wire 410, the passivation layer 415, the first dielectric layer 420, the etch stop layer 430, the second dielectric layer 440, the cap layer 450 and the plasma treatment 480. Detailed descriptions of each item are not repeated.

FIG. 4A shows an exemplary schematic cross-sectional configuration similar to that shown in FIG. 3A. The passivation layer 415, the first dielectric layer 420, the etch stop layer 430, the second dielectric layer 440 and the cap layer 450 are sequentially formed over the substrate 400.

FIG. 4B is a schematic cross-sectional drawing illustrating an exemplary structure after an aperture 460 is formed within the multi-layer structure and a plasma treatment 480 is performed.

A photoresist layer (not illustrated) is formed above the cap layer 450. By a traditional photolithographic process, an opening is formed within the photoresist layer. Then by using the patterned photoresist layer as an etch mask, portions of the cap layer 450 and the second dielectric layer 440 are removed to form the aperture 460. In these embodiments of a trench-first dual damascene structure, the aperture 460 is a trench opening. In addition, the removal of portions of the multilayer structure can be performed by a sequential anisotropic etching process. In the etching process, the etch stop layer 430 protects the first dielectric layer 420 from etching damage. As mentioned above in FIG. 3B, the removal of the portions of multilayer structure can be performed in different chambers. Moreover, not all of these layers must be applied upon the structure. Likewise, it is possible to include further layers in addition to those shown in FIG. 4A. Detailed descriptions are not repeated.

Then the plasma treatment 480 is applied. The plasma treatment 480 contains a halogen, for example, fluorine, chlorine, bromine or indium. If chlorine-containing plasma is used to treat the substrate, a chlorine-containing gas can be used as a source gas selected from a group consisting of $Cl_2$, HCl, $C_xCl_y$, $C_xH_yCl_z$ and mixtures thereof to generate the chlorine-containing plasma. In some embodiments, the plasma treatment 480 may further comprise nitrogen components and inert gas components. The nitrogen components can be generated from a nitrogen-containing gas, for example, $N_2$ or $N_2O$. The inert gas component can be generated from, for example, helium, neon, argon, or xenon. It is not necessarily required that both nitrogen and inert gas components be involved in the plasma treatment 380. For example, in some embodiments, $Cl_2$ used as the plasma source gas has a flow rate from about 5 to about 400 sccm, and Ar has a flow rate from about 10 to about 400 sccm. In these embodiments, the plasma treatment 480 can be performed in a tool having a dual power system by applying a top electrode power from about 200 to about 2000 watts, and a bottom electrode power from about 0 to about 400 watts. One of the ordinary skill in the art will understand how to fine tune the conditions disclosed in the exemplary embodiment and variations thereof to achieve the purpose of removing nitrogen-containing components or amine in the aperture 460.

FIG. 4C is a schematic cross-sectional diagram illustrating an exemplary structure after forming a patterned photoresist layer 490.

The purpose of the photoresist layer 490 is to form a via pattern for a trench-first dual damascene structure. The photoresist layer 490 can be, for example, a Deep Ultra-Violet (DUV) photoresist layer or any other material that can interact with nitrogen-containing material or low-k dielectric material. As mentioned above, nitrogen-containing material or low-k dielectric material is the source of amine. Due to the presence of amine, photoresist, especially DUV photoresist, cannot be fully transformed to a photo acid layer after being exposed to light. Therefore, the photoresist residues may attach on patterned feature edges or sidewalls of the aperture. Before the photoresist layer 490 is used to form a trench pattern on the substrate, the plasma treatment 480 is performed, completely or substantially reducing nitrogen-containing components or amine on the surfaces of the cap layer 450 and the etch stop layer 430, as well as the sidewalls of the aperture 460. Because the plasma treatment 480 can react with amine to form photo acid, the photoresist layer 490 for forming the via pattern will not react with the multilayer structure in accordance with FIG. 4C due to the elimination or reduction of amine.

By applying the halogen-containing plasma treatment prior to filling filled into the aperture, such as a via or contact hole, or a trench with photoresist, the photoresist residues in the aperture can be avoided.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method comprising:
   forming an aperture in a substrate using a first photoresist;
   removing said first photoresist;
   applying a chlorine-containing plasma treatment using a chlorine-containing gas consisting of one of $Cl_2$, $C_xCl_y$, and mixtures thereof to said aperture after removing said first photoresist to substantially reduce nitrogen-containing components on sidewalls and a bottom of said aperture; and
   filling said aperture with a second photoresist, wherein said chlorine-containing plasma treatment substantially prevents formation of photoresist residues by interaction of said nitrogen-containing components and said second photoresist.

2. The method of claim 1, wherein said aperture is a via or contact hole.

3. The method of claim 2, wherein said second photoresist is used to form a trench pattern.

4. The method of claim 1, wherein said second photoresist is a Deep Ultra-Violet (DUV) photoresist.

5. The method of claim 1, wherein said nitrogen-containing components comprise amine components.

6. The method of claim 5, wherein said step of applying said chlorine-containing plasma treatment reacts with said amine components such that a level of said amine component on said sidewalls of said aperture after the chlorine-containing plasma treatment is lower than a level of said amine components on said sidewalls of said aperture before the chlorine-containing plasma treatment.

7. The method of claim 1, wherein said chlorine-containing gas is $Cl_2$.

8. The method of claim 7, wherein said chlorine-containing plasma further comprises an inert gas component.

9. The method of claim 8, wherein said inert gas component uses (argon) Ar as a gas source.

10. The method of claim 9, wherein $Cl_2$ has a flow rate from about 5 sccm to about 400 sccm, and Ar has a flow rate from about 10 sccm to about 400 sccm.

11. The method of claim 10, wherein said chlorine-containing plasma further comprises a nitrogen component.

12. The method of claim 11, wherein said nitrogen component uses $N_2$ as a gas source.

13. A method comprising:
   forming a via or contact hole in a substrate using a first photoresist;
   removing said first photoresist,
   applying a plasma treatment using a chlorine-containing gas consisting of $Cl_2$ to the via or contact hole after the first photoresist is removed to reduce nitrogen-containing components on sidewalls and a bottom of said via or contact hole; and
   filling said via or contact hole with a second photoresist, wherein said plasma treatment substantially prevents formation of photoresist residues by interaction of said nitrogen-containing components and said second photoresist.

14. The method of claim 13, wherein said second photoresist is used to form a trench pattern.

15. The method of claim 14, wherein said second photoresist is a Deep Ultra-Violet (DUV) photoresist.

16. The method of claim 13, wherein said nitrogen-containing components comprise amine components.

17. The method of claim 16, wherein said step of applying said plasma treatment reacts with said amine components such that a level of said amine components on said sidewall of said via or contact hole after the plasma treatment is lower than a level of said amine components on said sidewalls of said via or contact hole before the plasma treatment.

18. The method of claim 13, wherein said plasma treatment comprises an inert gas component.

19. The method of claim 18, wherein said inert gas component uses (argon) Ar as a gas source.

20. The method of claim 19, wherein said $Cl_2$ has a flow rate from about 5 sccm to about 400 sccm, and Ar has a flow rate from about 10 sccm to about 400 sccm.

21. The method of claim 20, wherein said plasma treatment further comprises a nitrogen component.

22. The method of claim 21, wherein said nitrogen component uses $N_2$ as a gas source.

23. A method, comprising;
   providing a substrate having an amine containing material layer disposed thereon;
   forming a via or contact hole within said amine containing material layer by using a first photoresist pattern;
   removing said first photoresist pattern by a first photoresist removal process;
   treating said via or contact hole with a chlorine-containing plasma using a chlorine-containing gas consisting of one of $Cl_2$, $C_xCl_y$ and mixtures thereof after said first photoresist pattern is removed to substantially reduce amine components on sidewalls and bottom of said via or contact hole; and
   filling said treated via or contact hole with a Deep Ultra-Violet (DUV) photoresist used to form a trench pattern, wherein said chlorine-containing plasma treatment substantially prevent formation of photoresist residues by interaction of said amine components and said DUV photoresist.

24. The method of claim 23, wherein said chlorine-containing gas is $Cl_2$ to substantially remove photoresist residues within the via or contact hole.

25. The method of claim 24, wherein said chlorine-containing plasma further comprises an inert gas component.

26. The method of claim 25, wherein said inert gas component uses (argon) Ar as a gas source.

27. The method of claim 26, wherein $Cl_2$ has a flow raw from about 5 sccm to about 400 sccm, and Ar has a flow rate from about 10 sccm to about 400 sccm.

28. The method of claim 27, wherein said chlorine-containing plasma further comprises a nitrogen component.

29. The method of claim 28, wherein said nitrogen component uses $N_2$ as a gas source.

* * * * *

UNITED STATES PATENT AND TRADEMARK OFFICE
CERTIFICATE OF CORRECTION

| | | |
|---|---|---|
| PATENT NO. | : 7,279,428 B2 | Page 1 of 1 |
| APPLICATION NO. | : 10/736918 | |
| DATED | : October 9, 2007 | |
| INVENTOR(S) | : Shang Wei Lin and Hung Chang Hsieh | |

It is certified that error appears in the above-identified patent and that said Letters Patent is hereby corrected as shown below:

Column 7, line 54, delete "scem" and insert -- sccm -- therefor.

Column 8, line 30, delete "comprising;" and insert -- comprising: -- therefor.

Column 8, line 47, delete "prevent" and insert -- prevents -- therefor.

Column 8, line 58, delete "raw" and insert -- rate --.

Signed and Sealed this

First Day of April, 2008

JON W. DUDAS
*Director of the United States Patent and Trademark Office*